United States Patent [19]

Hartmann et al.

[11] Patent Number: 6,019,840
[45] Date of Patent: Feb. 1, 2000

[54] PROCESS FOR FORMING DEEP LEVEL IMPURITY UNDOPED PHOSPHOROUS CONTAINING SEMI-INSULATING EPITAXIAL LAYERS

[75] Inventors: Quesnell J. Hartmann; Gregory E. Stillman, both of Urbana, Ill.

[73] Assignee: The Board of Trustees of the University of Illinois, Urbana, Ill.

[21] Appl. No.: 08/884,353

[22] Filed: Jun. 27, 1997

[51] Int. Cl.[7] .................................................. C30B 25/16
[52] U.S. Cl. .............................. 117/89; 117/93; 117/102; 117/104; 117/954
[58] Field of Search .............................. 117/89, 93, 102, 117/104, 954

[56] References Cited

U.S. PATENT DOCUMENTS

| | | | |
|---|---|---|---|
| 4,716,130 | 12/1987 | Johnston, Jr. et al. | 117/89 |
| 5,255,281 | 10/1993 | Sugano et al. . | |
| 5,369,043 | 11/1994 | Hyuga et al. . | |
| 5,471,948 | 12/1995 | Burroughes et al. . | |
| 5,508,829 | 4/1996 | Freeouf et al. . | |
| 5,656,538 | 8/1997 | Gardner et al. | 117/953 |

OTHER PUBLICATIONS

"InGaP/GaAs Heterojunction Bipolar Transistor Grown on a Semi–Insulating InGaP Buffer Layer", Ahmari et al., *IEEE Electron Device Letters*, vol. 18, No. 11, Nov. 1997.
"Low–Temperature Growth of High Resistivity GaAs by Photoassisted Metalorganic Chemical Vapor Deposition", Roberts et al., *Appl. Phys. Lett.* 64 (18), May 2, 1994, pp.2397–2399.
"Semi–Insulating Nature of Gas Source Molecular Beam Epitaxial InGaP Grown at Very Low Temperatures", Look et al., *Appl. Phys. Lett.* 63 (9), Aug. 30, 1993, pp. 1231–1233.
"High Resistivity LT–$In_{0.47}GA_{0.53}P$ Grown by Gas Source Molecular Beam Epitaxy", Ramdani et al., *Journal of Electronic Materials*, vol. 22, No. 12, 1993, pp. 1481–1485.
"New MBE Buffer Used to Eliminate Backgating in GaAs Mesfet's", Smith et al., *IEEE Electron Device Letters*, vol. 9, No. 2, Feb. 1988, pp. 77–80.
"A Comparison of As and P–based Semiconductors Grown at Low Temperatures by MBE and GSMBE", Maracas et al., *Journal of Electronic Materials*, vol. 22, No. 12, 1993, pp. 1375–1381.
"Multiple Deep Levels in Metalorganic Vapor Phase Epitaxy GaAs Grown by Controlled Oxygen Incorporation", Huang et al., *Appl. Phys. Lett.* 65 (5), Aug. 1, 1994, pp. 604–606.
"VPE Growth of Vanadium–Doped High Resistivity GaAs", Terao et al., pp. 54–60.
"Review of Techniques for Epitaxial Growth of High–Resistivity GaAs—Growth Systems, Problems and Substrate Effects", Cox et al., pp. 41–56.
"Cr Redistribution in Epitaxial and Implanted GaAs Layers", Linh et al., pp. 206–213.
"Low Pressure Organometallic Growth of Chromium–Doped GaAs Buffers Layers", Bonnet et al., pp. 68–75.
"Semi–Insulating $In_{0.49}Ga_{0.51}P$ Grown at Reduced Substrate Temperature by Low–Pressure Metalorganic Chemical Vapor Deposition", Hartmann et al., *Appl. Phys. Lett.* 70 (14), Apr. 7, 1997, pp. 1822–1825.

*Primary Examiner*—Robert Kunemund
*Attorney, Agent, or Firm*—Greer, Burns & Crain, Ltd

[57] ABSTRACT

A reduced temperature low pressure metal organic chemical vapor deposition process for the production of semi-insulating deep level impurity undoped Group III–V phosphorous containing epitaxial layers. The present invention achieves production of semi-insulating layers at reduced growth temperatures in the approximate range of 490° C. to 530° C. Semi-insulating resistivities on the order of $10^6$ ohm-cm to $10^9$ ohm-cm are obtained according to the present process without resort to use of extrinsic dopants such as the transition metals typically used in conventional processes to obtain semi-insulating phosphorous containing layers, and without post processing annealing.

22 Claims, 4 Drawing Sheets

- ○ AIR OPERATED VALVE
- ▭ ELECTRONIC MASS FLOW CONTROLLER
- ⋈ NEEDLE VALVE (OPTIONAL FOR LOW PRESSURE OPERATION)

PROCESS FOR FORMING DEEP LEVEL IMPURITY UNDOPED PHOSPHOROUS CONTAINING SEMI-INSULATING EPITAXIAL LAYERS

This invention was made with Government support under Contract Number NSF ECD 89-43166 awarded by the National Science Foundation and Contract Nos. DAAH 04-93-0172 and N66001-96-C-98-8615 awarded by the Army Research Office. The Government has certain rights in this invention.

FIELD OF THE INVENTION

The present invention relates generally to the production of deep level impurity undoped semi-insulating layers of indium gallium phosphide (InGaP) or other phosphorous containing Group III–V compounds using a commercially favorable low pressure metal organic chemical vapor deposition (LP-MOCVD) technique. More particularly, the present invention relates to a LP-MOCVD process for producing deep level impurity undoped semi-insulating layers of InGaP using a reduced temperature growth system that is otherwise similar to standard LP-MOCVD processes used to produce conductive and semiconductive InGaP layers. The LP-MOCVD process of the present invention results in high resistivity, produces single crystal layers that are lattice matched to GaAs, and is more easily implemented than typically utilized extrinsic deep level doping, annealing and photoassisted techniques for producing semi-insulating epitaxial layers by MOCVD and other processes, such as gas source molecular beam epitaxy (GS-MBE).

BACKGROUND OF THE INVENTION

Semiconductor integrated circuits are the fundamental building blocks of modern electronic devices. Computers, cellular phones, and consumer electronics rely extensively on these devices, which may be used for storage of, computations on, and communication of data.

The most common semiconductor devices are formed using silicon as the primary substrate substance. Layers and regions of N-type material, P-type material, and semi-insulating material are combined to form electronic devices and circuits. N-type material is material in which excess electrons act as charge carriers. In a P-type material, holes (missing electrons) act as charge carriers for the flow of electricity. A semi-insulator material is one which has a high resistance to current flow and may be used to isolate components of a circuit or a device, and act as a substrate on which active devices may be epitaxially grown. Shallow level impurity dopants are generally expected to provide conductive qualities to produce N-type and P-type materials, while deep level impurity dopants provide resistance to current flow by acting as traps for any charge carriers overcome only by significant ionization energy to thereby produce semi-insulating material.

The arrangement of P-type, N-type, and insulative materials and the respective electrical connections to each will determine what type of electrical device is created. Transistors, diodes, capacitors and most other electrical devices are created through the arrangement of these materials in a semiconductor device.

Recently, the advantages of using the Group III-V semiconductors (semiconductors formed from compound alloys including Group III and Group V elements) instead of silicon have led to extensive research and development. Among the typically used compounds and alloys are gallium arsenide (GaAs), aluminum gallium arsenide (AlGaAs) and indium gallium phosphide (InGaP). The basic designs for the transistors and other devices used in silicon-based electronic devices have been adapted to Group III–V materials. Devices made from the Group III-V materials generally require lower power and are faster (operate at high frequencies).

Group III–V semiconductor material may also be used to produce optoelectronic devices, such as semiconductor lasers. In such devices an active region of undoped or low-shallow level doped semiconductor material that is sandwiched between dual layers of P-type and N-type shallow level doped materials emits coherent light in response to the application of electrical current. The light is produced when holes from the P-type material recombine with electrons from the N-type material in the active region.

Other applications of the Group III-V materials are known to those in the art and include optical detectors, high speed amplifiers and logic circuits. The widespread substitution of these semiconductors for silicon devices is impeded by relative difficulty and expense in producing Group III–V semiconductors and semi-insulators in comparison to the silicon devices.

One difficulty in producing Group III-V devices concerns the processes used for the production of GaAs compatible semi-insulating layers. GaAs is the primary building block for typical Group III-V devices. A preferred technique for production of commercial GaAs is the LP-MOCVD process, since it is well suited to mass production.

Several semi-insulating GaAs-based layers have been produced by the LP-MOCVD technique. However, these techniques typically require the use of an extrinsic deep level dopant during growth to produce highly resistive material. Generally, two types of deep level impurity dopants have been used: transition metals, such as iron, and oxygen.

Transition metals are problematic because of their high diffusivity in semiconductor material such as GaAs. Thus, the dopant will diffuse out of the highly resistive layer during the growth of subsequent layers or thermal cycling during device fabrication, contaminating neighboring epitaxial layers.

One particular transition metal doping technique is iron doping. Typically, a precursor of iron pentacarbonyl or ferrocene is used in conjunction with MOCVD growth of epitaxial phosphorous containing layers. High resistivity on the order of $10^9$ ohm-cm is realized through this technique.

Such iron doping techniques have a number of difficulties. One of the difficulties is recognized by Dentai et al., U.S. Pat. No. 4,782,034. That patent noted that iron doped indium phosphide layers have poor thermal stability, i.e., performance is sensitive to temperature. Addressing this problem, the Dentai patent adopts doping using a titanium-based metal-organic dopant precursor. Similar to iron doping techniques, fairly high temperature is used in the growth to decompose the precursor according to Dentai, on the order of 650° C. Dentai contemplates decomposition of the titanium precursors at temperatures of up to 850° C. Temperatures on this order may induce dopant diffusion which reduces the degree of control over the location of growth of the insulating material, thereby leading to the contamination of neighboring layers.

Further difficulties may arise from the nature of the precursors used for iron doping and other transition metal doping techniques. The aforementioned ferrocene and iron pentacarbonyl tend to leave behind a residue in the reactor.

The residue then may act as a contaminant during further growth in the reactor. Thus, a separate crystal growth chamber system is sometimes dedicated to the growth of the iron-doped indium phosphide. This is expensive since a commercial growth reactor may cost one million dollars or more. Oxygen doping to produce high-resistivity GaAs-based material has similar drawbacks. Particularly, the oxygen dopant source can contaminate the reactor chamber so that subsequently grown layers will also be deep level doped with oxygen, which is undesirable. Both of these techniques therefore make it difficult to integrate device quality epitaxy and highly resistive layers into the same growth run or using the same growth chamber. Similar problems are expected for $In_{0.49}Ga_{0.51}P$ doped with transition metals or oxygen.

Another extrinsic technique, preferable to the transition metal techniques, is the halide doping technique of Gardner et al., commonly assigned U.S. patent application Ser. No. 08/410,782, filed Mar. 24, 1995. That technique produced good resistivites on the order of $10^9$ ohm-cm through LP-MOCVD growth without post-processing annealing. While this is an efficient process, some complexity is added by the need for a dopant source. In addition, certain ones of the halide dopant sources, such as $CCl_4$ are highly regulated due to environmental concerns.

A photoassisted MOCVD process has also been proposed to produce semi-insulating materials. See, Roberts et al., "Low-Temperature Growth of High Resistivity GaAs by Photoassisted Metalorganic Chemical Vapor Deposition", Appl. Phys. Lett. 64 (18), May 2, 1994. However, the highest nonannealed resistivity obtained was about $10^6$ ohm-cm. This is below typical commercially acceptable semi-insulators, which are on the order of $10^7$ ohm-cm. In addition, the photoassisted technique involves the raster scanning of laser light during the reaction. This adds complexity to the growth system, and may not be easily adapted to larger area layers than those produced experimentally since the demonstrated scan length was about 1 mm.

GS-MBE has also been used to produce GaAs compatible semi-insulating layers of phosphorous containing materials. Specifically, high-resistivity $In_{0.49}Ga_{0.51}P$ (referred to as InGaP) has been demonstrated by GS-MBE. The GS-MBE layers are typically grown at below standard temperature and do not require an extrinsic dopant source to obtain "as-grown" semi-insulating resistivities of up to about $10^6 \Omega$-cm. To achieve higher resistivities that are more acceptable for use as isolation regions (>$10^6 \Omega$-cm, $10^7$–$10^9$ are typically considered good semi-insulator levels), however, the material must be annealed at 600° C. for 60 minutes. Annealing procedures are not desirable because thermally cycling epitaxial layers can cause dopant diffusion into neighboring layers or intermixing of atoms at interfaces between different materials. The GS-MBE growth technique is also not as commercially desirable as LP-MOCVD.

OBJECTS OF THE INVENTION

Accordingly, it is an object of the present invention to provide an improved LP-MOCVD process for the production of semi-insulating phosphorous containing GaAs-compatible material. A related object of the invention is to provide a LP-MOCVD process for the production of semi-insulating phosphorous containing layers without the use of extrinsic deep level doping sources during layer growth.

Another object of the present invention is to provide an improved LP-MOCVD process for the production of semi-insulating deep level impurity undoped phosphorous containing Group III-V layers which have resistances in the approximate range of between $10^6$ ohm-cm and $10^9$ ohm-cm.

Still another object of the present invention is to provide an improved LP-MOCVD process for the production of semi-insulating deep level impurity undoped phosphorous containing Group III–V layers that includes the heating of a substrate to a slightly reduced from standard growth temperature and the formation of a semi-insulating layer which is single crystal and lattice matched to GaAs solely through the introduction of InGaP precursors.

A further object of the present invention is to provide an improved LP-MOCVD process for the production of semi-insulating deep level impurity undoped InGaP having a resistivity of approximately $10^9$ ohm-cm at reduced from standard growth temperatures using standard growth reactor pressure, Group III–V ratios, growth rate, and without ancillary growth techniques, such as photo assistance, or post-processing techniques, such as annealing.

SUMMARY OF THE INVENTION

The present invention concerns a LP-MOCVD process for the growth of deep level impurity undoped semi-insulating phosphorous containing Group III-V layers. The layers produced according to the present process are preferably single crystal and lattice matched to GaAs. Excellent semi-insulating resistivities in the approximate range from $10^6$ ohm-cm to $10^9$ ohm-cm are achieved without extrinsic dopants, ancillary growth assistance, or post-growth annealing procedures. A reduced growth temperature in the approximate range of 490° to 530° C. is used with standard LP-MOCVD growth parameters for growth reactor pressure, Group III–V ratio, and growth rate. The reduced temperature is maintained during the introduction of the phosphorous containing Group III–V precursors to form a semi-insulating layer.

In a preferred embodiment, semi-insulating InGaP layers lattice matched to GaAs are grown using largely standard and commercially viable LP-MOCVD growth processes in which the growth temperature is reduced. Growth precursors of triethylgallium, trimethylindium and pure phosphine are directed over a GaAs substrate heated to a reduced substandard temperature, preferably of approximately 500° C. using purified hydrogen as a carrier gas for the growth precursors. Otherwise, standard LP-MOCVD growth parameters are preferably used, namely, a growth chamber reactor pressure of about 76 Torr, a growth rate of approximately 450 Å/m and a Group V/III ratio of approximately 260. The incorporation of many standard LP-MOCVD procedures without the use of extrinsic deep level doping and/or annealing renders the present process totally adaptable to present commercial GaAs growth systems, while also producing highly resistive semi-insulating InGaP.

BRIEF DESCRIPTION OF THE DRAWINGS

Other features, objects, and advantages of the invention will be apparent by reference to the detailed description and the drawings, of which.

DETAILED DESCRIPTION OF THE INVENTION

The present invention provides GaAs matched LP-MOCVD grown semi-insulating layers without use of an extrinsic doping source. The present LP-MOCVD process is completely compatible with device epitaxy because it eliminates problems associated with dopant diffusion into neighboring epilayers. It also eliminates memory effects that are either caused by the long residence time of extrinsic deep level impurity dopants that eventually incorporate in subsequent growth layers or by the adsorption of extrinsic deep level impurity dopants onto the chamber sidewalls that slowly out-diffuse during the growth of subsequent layers. In both cases, the memory effect causes the incorporation of the extrinsic deep level impurity dopant into subsequently grown epitaxial layers where it is not desired because it degrades the epilayer quality.

The LP-MOCVD process of the invention is conducted at reduced growth temperatures (approximately 490° C.–530° C.) and results in high semi-insulating resistivities (~$10^9$Ω-cm) without annealing, a necessary step in current GS-MBE processes to grow high resistivity InGaP layers. The elimination of annealing is also beneficial for devices incorporating this layer because annealing can cause degradation in the device semiconductor material and interfaces.

The lack of a stable semi-insulating layer compatible with GaAs-based devices and epitaxy by LP-MOCVD is currently a major limitation to the increased application of the MOCVD technique, since several such layers commonly grown in different growth systems (such as annealed MBE-based growth) have been shown to substantially improve device performance. The process disclosed herein overcomes this limitation, and provides an improved technique for the incorporation of semi-insulating GaAs lattice matched phosphorous containing layers into many Group III-V electronic devices.

Figure 1:
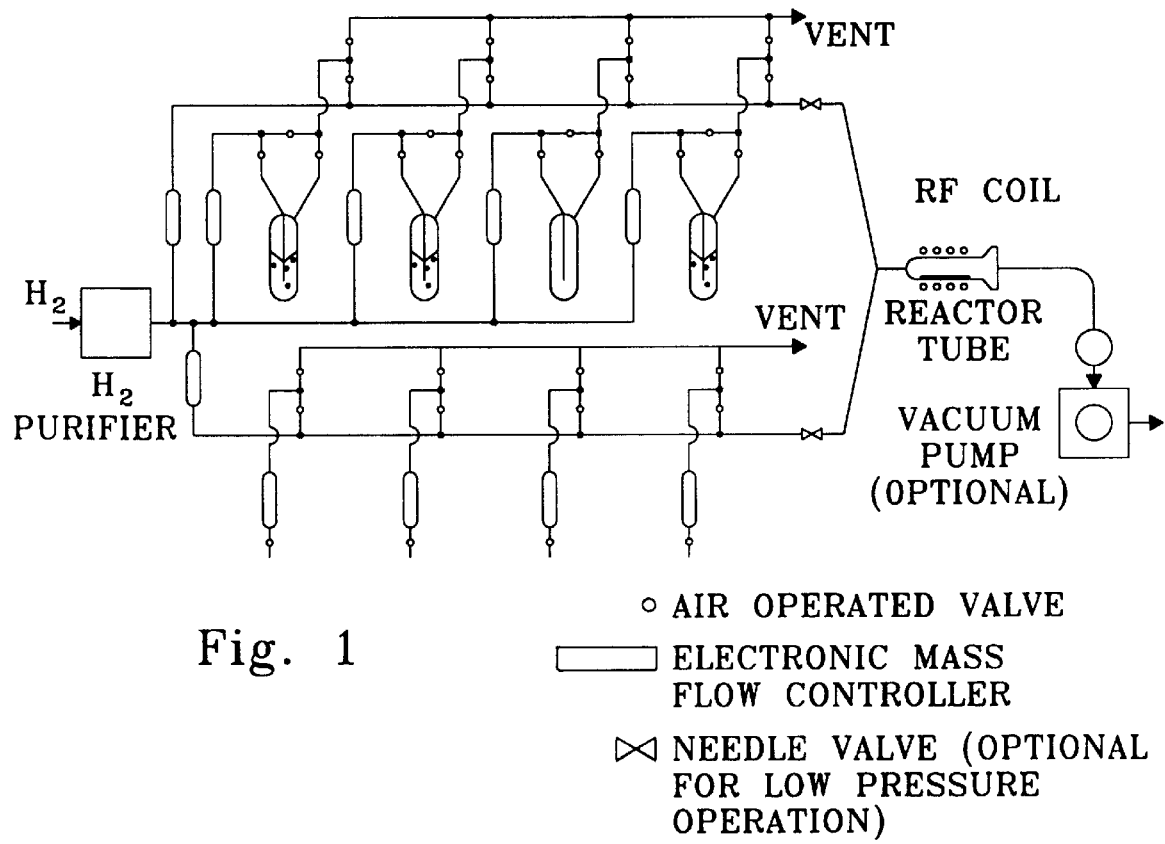
FIG. 1 is a reactor diagram showing the configuration of a MOCVD reactor which may be used to practice the present process for growing deep level impurity undoped semi-insulating phosphorous containing Group III-V layers.

The preferred embodiment for the production of high resistivity InGaP layers lattice matched to GaAs uses a reduced growth temperature of approximately 490° C.–530° C. combined with selected standard LP-MOCVD growth parameters. A suitable LP-MOCVD growth system 10 for practicing the present invention is shown in FIG. 1. The physical components of the system are identical to conventional LP-MOCVD reactors, and explanation thereof is accordingly omitted. To practice the present LP-MOCVD process, the reactor coil 12 in the reactor tube 14 is controlled to reduce substrate temperature to about 490° C.–530° C. during formation of semi-insulating layers. The experimental setup for samples for which data is reported herein was slightly different than that shown in FIG. 1. Namely, a resistor was used in place of the coil 12 and the reactor tube 14 was vertically disposed.

Other standard LP-MOCVD parameters are utilized. Preferably, the growth precursors of triethylgallium, trimethylindium and 100% phosphine are directed over a reduced temperature GaAs substrate using purified hydrogen as a carrier gas, a chamber pressure of approximately 76 Torr, a growth rate of approximately 450Å/m and a V/III ratio of approximately 260. All of these parameters are standard for producing "normal" low resistivity (p<1Ω-cm) InGaP lattice matched to GaAs. The growth temperature of approximately 490° C.–530° C. however, results in highly resistive layers with a resistivity of approximately $10^6$–$10^9$Ω-cm. No extrinsic dopant source is necessary to grow the highly resistive InGaP according to the present invention, and post processing annealing is avoided.

Figure 2:
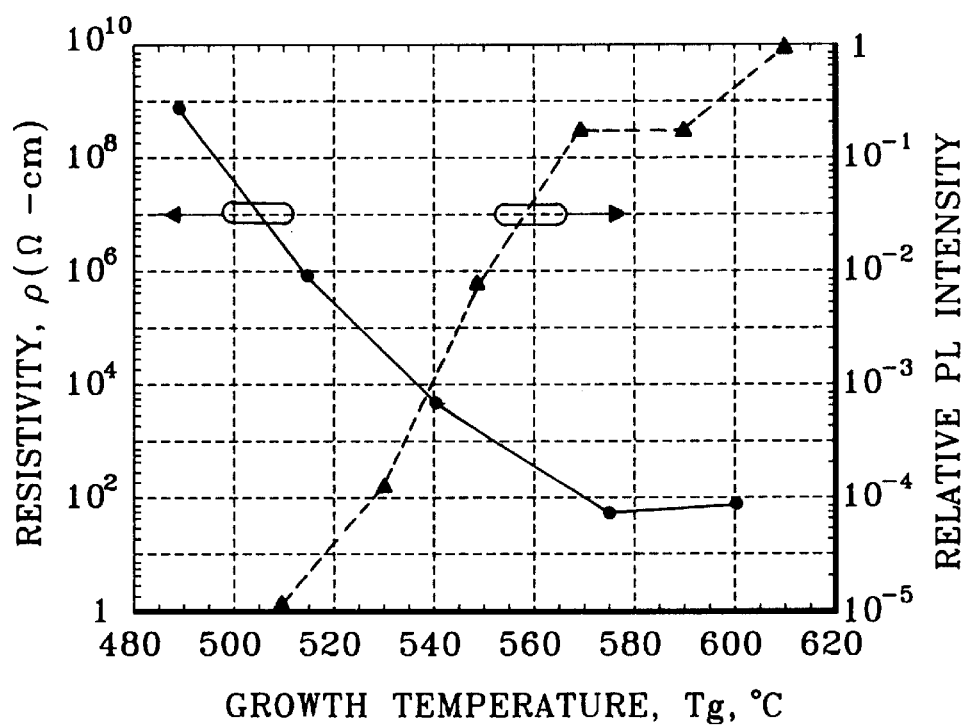
FIG. 2 is a plot which compares resistivity and relative photoluminescence intensity of 1.5 μm thick InGaP layers as a function of growth temperature, and shows the highly resistive nature of reduced temperature layers produced in accordance with the present invention.

Temperatures reported in data herein are obtained from the thermocouple temperature, estimated to be up to +30° C. of the actual substrate temperature. It will be understood that any references to a particular substrate temperature herein must be adjusted if different measurement techniques are to be used, and that references to particular substrate temperatures may be up to 30° C. higher than the actual substrate temperature. The temperature reporting convention is adopted since the actual substrate temperature is difficult to measure during growth. The present work, as shown in FIG. 2, shows that reduced temperatures of approximately 490° C. to 530° C. produce semi-insulating material, while the conventional temperatures near 600° C. produce conductive material.

Importantly, the high resistivity growth process is accomplished without extrinsic deep level impurity dopants. FIG. 2 shows the resistivity of $In_{0.49}Ga_{0.51}P$ as a function of the thermocouple growth temperature. The only growth precursors used are those for III-V material, namely triethylgallium, trimethylindium, 100% phosphine and hydrogen carrier gas. The plot of FIG. 2 shows that below approximately 575° C., the resistivity begins to increase exponentially until a resistivity of approximately $10^9$Ω-cm is reached for samples grown at approximately 490° C. The trend indicates that even higher resistivities may be obtained at lower growth temperatures, though the resistance is expected to flatten out at some growth temperature lower than 490° C. The quality of lower temperature layers is also a concern. The layers in the FIG. 2 plot were device quality epitaxial layers, but surface morphology is expected to degrade at temperatures significantly lower than 490° C.

The layers that form to have conductive qualities are reached at about 600° C. and above, which is the range utilized conventionally in production of shallow level doped conductive materials. Also shown in FIG. 2 is the relative photoluminescence intensity as a function of the growth temperature. The intensity begins to decrease exponentially for samples grown below approximately 575° C., continuing until intensity decreases four levels of magnitude to $10^{-5}$ at approximately 530° C. This indicates that the incorporation of nonradiative recombination centers increases with decreasing growth temperatures and suggests that a deep level forms in the material at reduced growth temperature. Incorporation of a sufficient concentration of deep level traps is an explanation for the highly resistive behavior produced according to the present MOCVD process, as is further illustrated with respect to FIG. 6 and its associated description.

Figure 3:
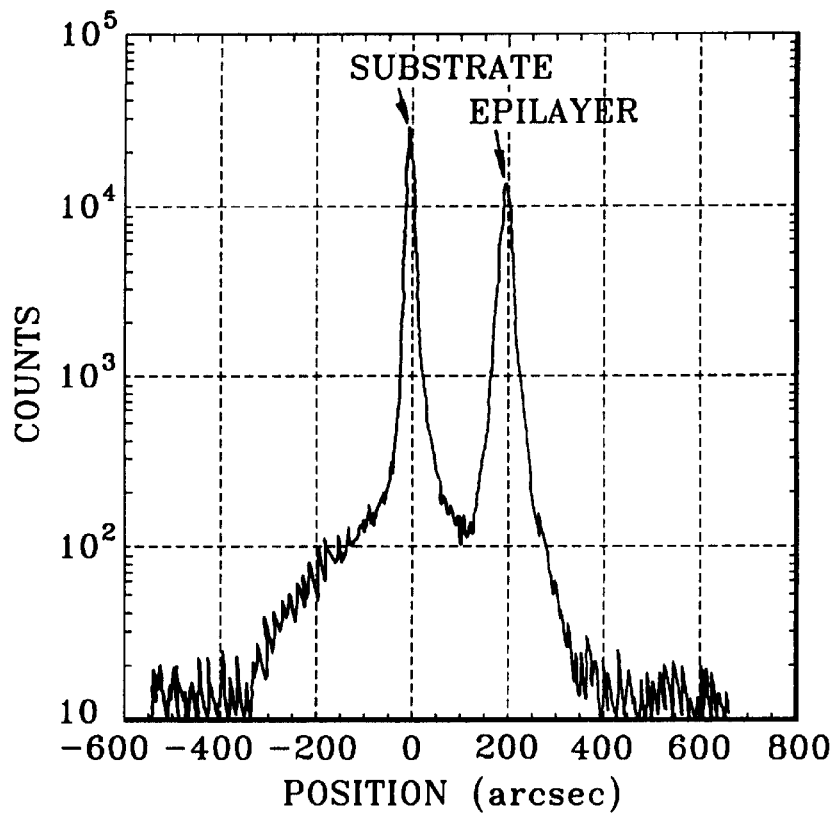
FIG. 3 is an x-ray rocking curve generated from a double crystal x-ray diffraction measurement of a 1.5 micrometer thick layer of InGaP grown at a reduced temperature of 530° C. on a GaAs substrate in accordance with the present invention.

Though temperatures below the conventional 600° C. might be expected to produce layers with unsuitable morphology, the layers grown by the present reduced temperature process are epitaxial and lattice matched to GaAs. Double crystal x-ray diffraction measurements of samples grown at reduced temperature according to the invention indicate that the resulting semi-insulating InGaP is single crystal and of high structural quality, and is thus structurally compatible with subsequent epitaxial layers. This is shown in FIG. 3, which is an x-ray rocking curve of a 1.5 $\mu$m thick InGaP sample grown at 530° C. The full width at half maximum (FWHM) of the epilayer peak is approximately 21 arcsec, which is comparable with that of the substrate peak (FWHM~14 arcsec) and InGaP layers grown at standard higher temperatures$\geq$600° C. that usually have 20<FWHM <60 arcsec.

Figure 4:
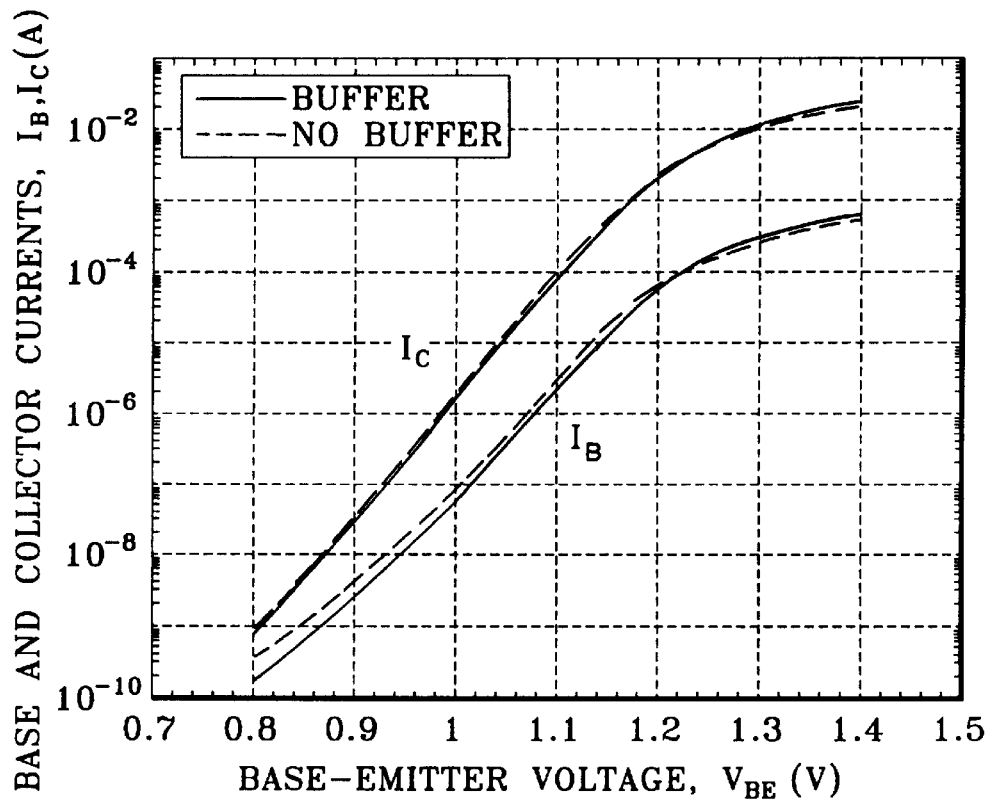
FIG. 4 is a Gummel plot of an HBT (heterojunction bipolar transistor) with a 2000 Å high resistivity $In_{0.49}Ga_{0.51}P$ buffer layer and a standard HBT without a buffer layer isolated by etching into the substrate.

The compatibility of material grown according to the reduced temperature LP-MOCVD process of the invention with subsequent epitaxial layers was also demonstrated by the fabrication of experimental devices. Fabrication of the devices further showed that layers formed through the present process can be integrated into a single growth run with device quality material without negative side effects. Two heterojunction bipolar transistors were grown. Once of the devices was grown on a 2000Å thick InGaP buffer layer grown at 500° C. (estimated resistivity of~$10^8 \Omega$-cm) according to the present invention with an etch to the surface of the buffer layer for isolation. The other device was grown directly on the GaAs semi-insulating substrate without the buffer layer, using a conventional through surface substrate etch for isolation. The Gummel plot for the two devices is compared in FIG. 4. The results show no significant difference between the devices, indicating that the buffer layer grown by the process of the invention did not adversely affect device operation. The devices also demonstrated that layers produced according to the present invention do not contaminate or degrade subsequent epitaxial materials, unlike previous extrinsic deep level impurity doping and annealing methods for producing high resistivity layers, and that the resulting layer is structurally compatible with subsequent epitaxial material.

$In_xAl_{1-x}$ layers should also result in highly resistive material using the present temperature reduced process as Al and Ga share very similar properties. A standard aluminum source such as trimethylaluminum instead of triethylgallium would be used for this purpose. Since Ga and Al are easily interchanged in many III-V compounds, many quaternary compositions of $In_{0.5}(Al_xGa_{1-x})_{0.5}P$ are logical candidates for producing semi-insulating material lattice matched to GaAs using this method as well as $In_x(AlGa)_{1-x}P$ compositions which are not lattice matched to GaAs.

Figure 5:
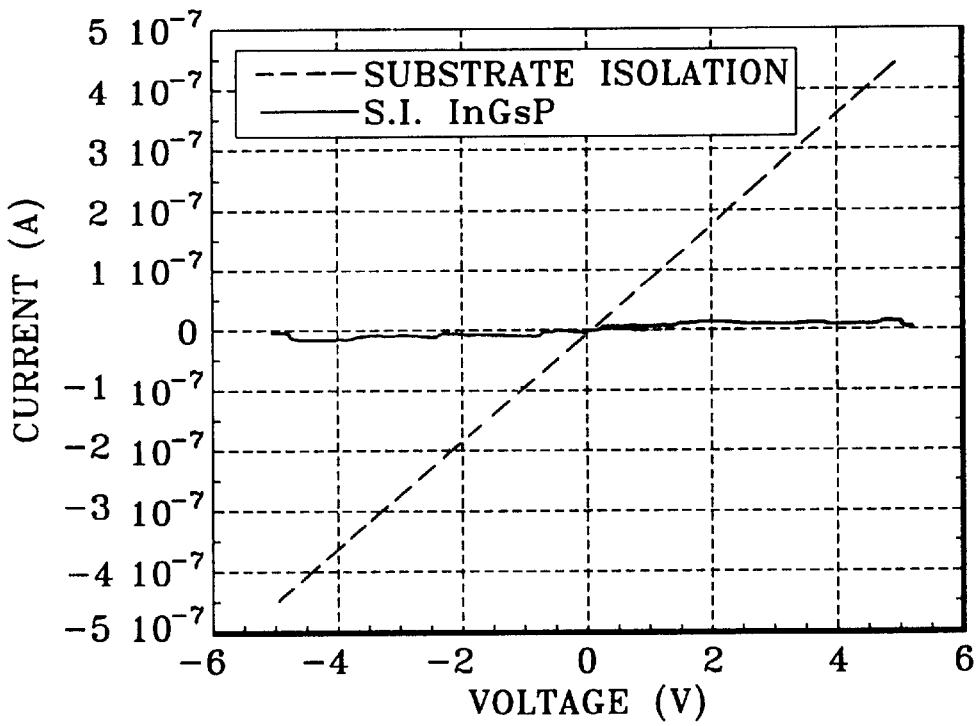
FIG. 5 is an I–V plot comparing the isolation effectiveness of the conventional substrate etch and the buffer layer of the invention from the devices producing the data for FIG. 4.

Device isolation testing of InGaP grown according to the present invention was also conducted using the sample devices. An I–V curve was taken between two neighboring devices for the two cases and the resistance is indirectly proportional to the slope of the curve. FIG. 5 shows the obtained data which indicate that the resistance of the InGaP buffer layer grown using this technique has a higher resistance than the semi-insulating conventional GaAs substrate. This indicates that high resistivity InGaP is equally or effective for forming isolation regions between devices.

Figure 6:
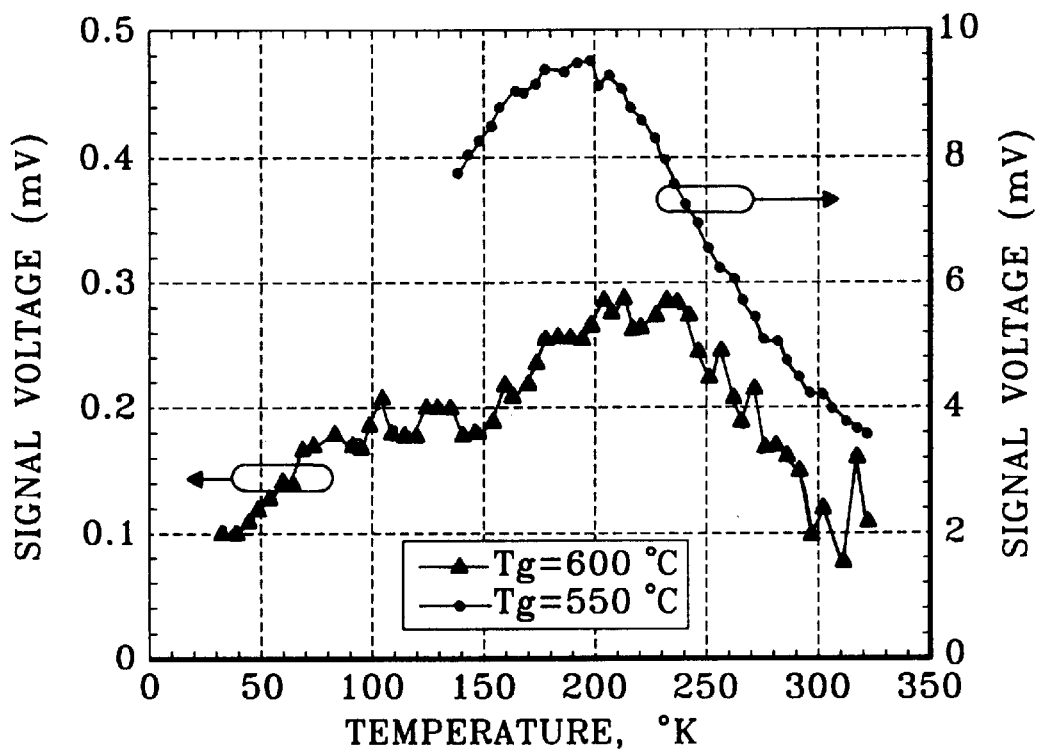
FIG. 6 is a plot of the signal voltage as a function of measurement temperature of constant capacitance deep level transient spectroscopy measurements comparing a sample InGaP layer grown at a reduced growth temperature of approximately 550° C. to a conventional conducting InGaP layer grown through MOCVD at an approximate growth temperature of 600° C.

Two possible mechanisms for the high semi-insulating resistivities produced by the present invention are the increased presence of an residual deep level (one produced from the Group III–V reactants) during the reduced temperature growth and the incorporation of unintentional dopants during growth. To investigate the presence of an residual deep level, constant capacitance deep level transient spectroscopy measurements were performed, and the data are shown in FIG. 6, which is a plot of the voltage signal of a conventional InGaP sample grown at 600° C. and of a sample grown at 550° C. with light shallow level impurity dopants. The 550° C. temperature was necessary to obtain any measurements, since none could be made at lower temperatures.

Shallow level impurity dopants were added in an effort to increase conductivity of lower temperature samples, e.g. 490–530° C., for purposes of the deep level spectroscopy measurements. Surprisingly, even the shallow level impurities failed to measurably decrease resistivities of such layers. Thus, it is apparent that the presence of shallow level dopants, such as silicon, during growth according to the present invention will not have an adverse affect upon the process for producing semi-insulating layers according to the invention.

In FIG. 6, the signal voltages for the 550° C. samples are plotted to the right ordinate axis, and those of the 600° C. sample to the left ordinate axis. Both samples were lightly shallow level doped with silicon to facilitate signal voltage measurement. A broad peak is apparent in the signals obtained from both samples, but the peak is 30 times stronger in the sample grown at 550° C. This experiment confirms the presence of residual deep levels and increased concentration of such deep levels at lower growth temperatures, suggesting that such increased number of deep levels is a likely cause for the highly resistive behavior in layers produced by the reduced temperature LP-MOCVD growth process of the invention.

The spectroscopy measurements also revealed a 0.40 eV ionization energy in the 550° C. sample. The ionization energy suggests that the residually produced deep level demonstrated in FIG. 6 might be attributable to the excess incorporation of phosphine during growth of layers via the present invention.

Figure 7:
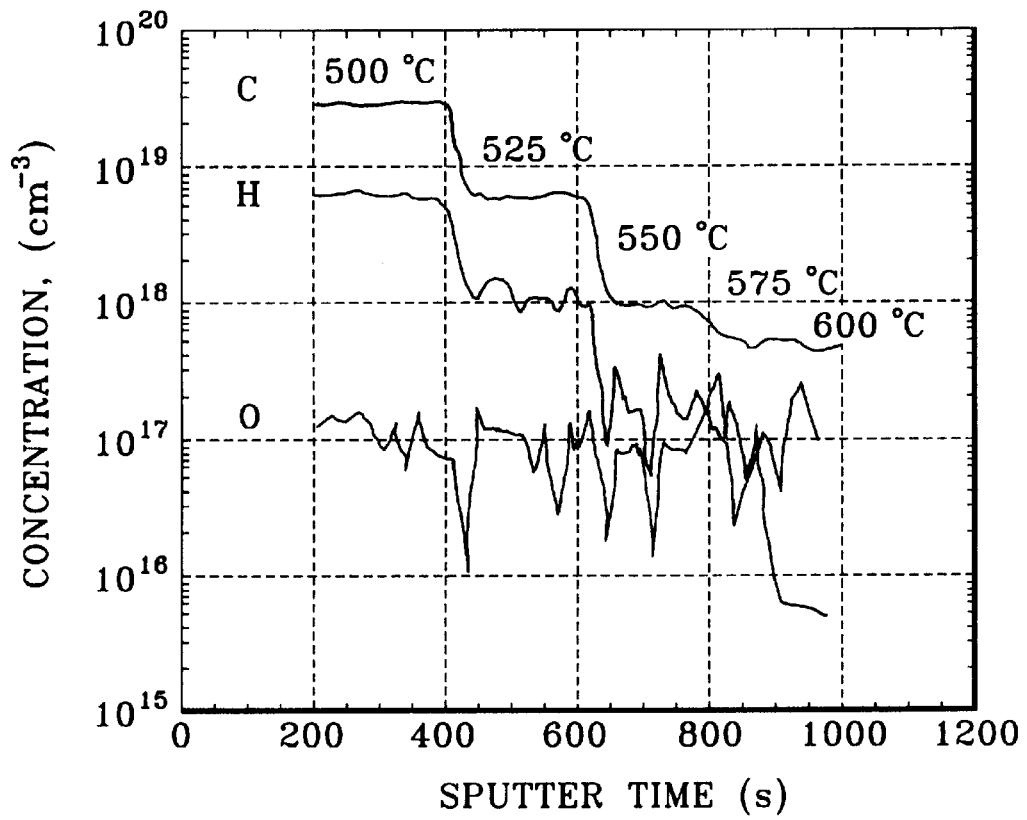
FIG. 7 is a plot of hydrogen, carbon and oxygen concentrations of InGaP layers grown in accordance with the present invention at temperatures between approximately 500° C. and 530° C. and a conventional InGaP layer grown at approximately 600° C.

The contribution of unintentional carbon and hydrogen doping to the semi-insulating resistivities obtained by the present invention is suggested in the FIG. 7 plot of hydrogen, carbon and oxygen concentrations for temperatures ranging from the reduced 490° C.–530° C. range of the present invention to the conventional LP-MOCVD 600+° C. range. The data in FIG. 7 was obtained by secondary ion mass spectroscopy measurements, and shows the concentration of carbon, hydrogen and oxygen of an InGaP sample with five layers grown at five different temperatures in a single growth run. The data shows that significant amounts of carbon and hydrogen incorporate in the layer at reduced temperatures, and that the oxygen content does not increase above the background level of~$10^{17}$ $cm^{-3}$. This suggests that carbon and/or hydrogen may also be related to the high resistivity behavior of layers grown according to the invention. The contribution of carbon and hydrogen might be used to produce higher resistivities in the mid to upper end of the approximate 490° C.–530° C. reduced temperature LP-MOCVD growth range. Intentional adding of carbon and hydrogen should increase the resistivity at the mid to upper end, if not through the whole reduced temperature range. Unlike extrinsic deep level transition metal dopants, intentional addition of these background impurity dopants does not pose a threat of subsequent layer contamination.

Figure 8:
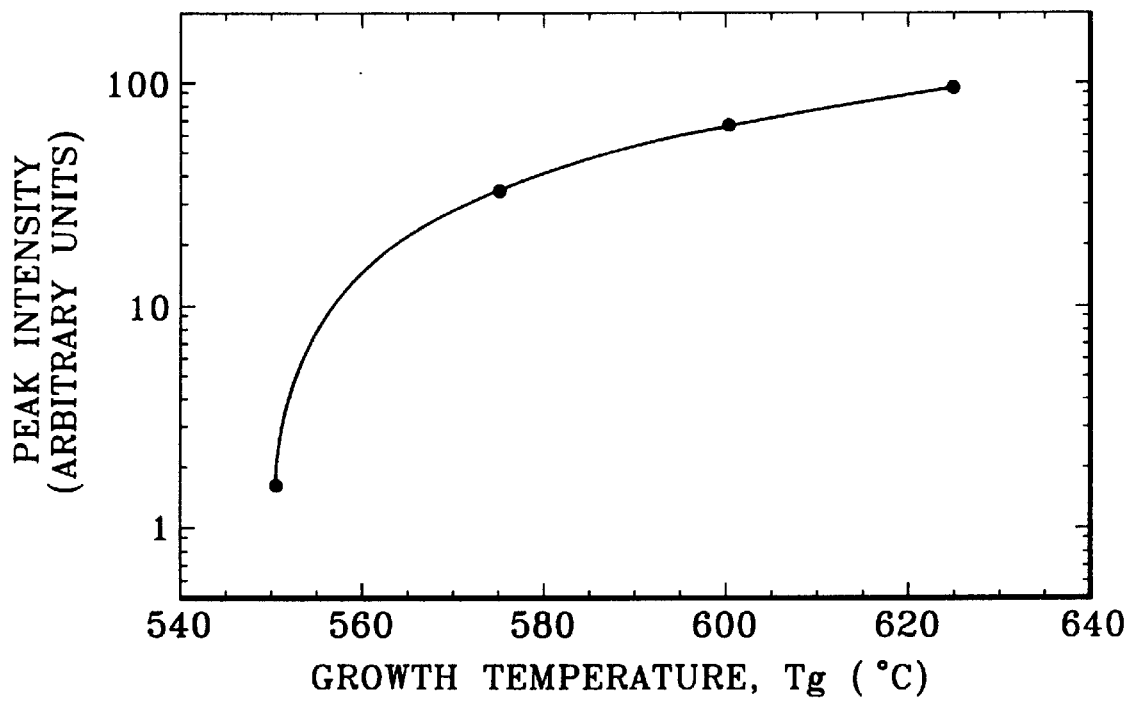
FIG. 8 is a plot of the relative photoluminescence intensity of InGaP layers using trimethylgallium as a substitute for triethylgallium as the gallium precursor for growth temperatures in the present approximate reduced growth temperature range of between about 500° C. and 530° C. and 1 up to and exceeding the conventional approximate 600° C. growth temperature.

To ensure that the reduced temperature results were not limited to the particular precursors used in obtaining initial samples, growth was also conducted according to the present invention using an alternate set of precursors. The PL intensity as a function of growth temperature of $In_{0.49}Ga_{0.51}P$ using trimethylgallium rather than triethylgallium as the gallium precursor is shown in FIG. 8. The trend is similar to that observed in FIG. 2 in that the intensity begins to decrease rapidly for Tg<575° C., and that semi-insulator resistivities therefore commence near the approximate 530° C. temperature as indicated and discussed with respect to FIG. 2. This indicates that either gallium precursor can be used to produce high resistivity material. The similar behavior of both trimethylgallium and triethylgallium precursors shows that alternative indium, gallium or phosphorous sources should produce semi-insulating materials utilizing the present reduced temperature LP-MOCVD process.

The data obtained through experiment using the present reduced temperature process thus demonstrated high resistivity InGaP lattice matched to GaAs. Because of their similar properties, compositions of $In_xGa_{1-x}P$ where x is between 0 and 1 including GaP should also prove highly resistive under these growth conditions. In addition, the invention may be applied to the growth of similar materials such as $In_xAl_{1-x}P$ and $In_x(Al_yGa_{1-y})_{1-x}P$ to produce similar results.

Thus, while various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A LP-MOCVD process for forming semi-insulating phosphorous containing Group III–V epitaxial layers, the process consisting essentially of the following steps:
   heating a substrate in a LP-MOCVD reactor; and
   forming a semi-insulating phosphorous containing Group III–V layer having a resistance exceeding approximately $10^6$ ohm-cm upon said substrate through introduction of phosphorous containing Group III–V precursors into said reactor.

2. The LP-MOCVD process according to claim 1, wherein said substrate is heated to a temperature of approximately 530° C. or less.

3. The LP-MOCVD process according to claim 2, wherein said substrate is heated to a temperature of between approximately 490° C. and 530° C.

4. The LP-MOCVD process according to claim 3, wherein said semi-insulating phosphorous containing Group III–V layer is formed to have a resistance of approximately $10^9$ ohm-cm.

5. The LP-MOCVD process according to claim 2, wherein said precursors comprise triethylgallium, trimethylindium and phosphine.

6. The LP-MOCVD process according to claim 1, wherein said semi-insulating phosphorous containing Group III–V layer is formed to have a resistance of approximately $10^9$ ohm-cm.

7. The LP-MOCVD process according to claim 6, wherein said precursors comprise triethylgallium, trimethylindium and phosphine.

8. The LP-MOCVD process according to claim 1, wherein said semi-insulating phosphorous containing Group III–V layer is single crystal material that is lattice matched to GaAs.

9. The LP-MOCVD process according to claim 1, wherein said semi-insulating phosphorous containing layer is InGaP.

10. The LP-MOCVD process according to claim 1, wherein said step of forming is conducted at a standard LP-MOCVD reactor pressure, Group V/III ratio, and growth rate.

11. A LP-MOCVD process for forming semi-insulating phosphorous containing Group III–V epitaxial layers, the process comprising the following steps:
    heating a substrate in a LP-MOCVD reactor; and
    forming a semi-insulating phosphorous containing Group III–V layer having a resistance exceeding approximately $10^6$ ohm-cm through introduction of Group III–V precursors as sole intentional reactants into said reactor.

12. The LP-MOCVD process according to claim 11, wherein said step of forming is completed with the introduction of said precursors in the absence of intentional dopants.

13. The LP-MOCVD process according to claim 11, wherein said step of forming is completed with the introduction of said precursors in the absence of post formation processing.

14. The LP-MOCVD process according to claim 11, wherein said substrate is heated to a temperature of approximately 530° C. or less.

15. The LP-MOCVD process according to claim 14, wherein said substrate is heated to a temperature of between approximately 490° C. and 530° C.

16. The LP-MOCVD process according to claim 15, wherein said semi-insulating phosphorous containing Group III–V layer is formed to have a resistance of approximately $10^9$ ohm-cm.

17. The LP-MOCVD process according to claim 14, wherein said precursors comprise triethylgallium, trimethylindium and phosphine.

18. The LP-MOCVD process according to claim 11, wherein said semi-insulating phosphorous containing Group III–V layer is formed to have a resistance of approximately $10^9$ ohm-cm.

19. The LP-MOCVD process according to claim 18, wherein said precursors comprise triethylgallium, trimethylindium and phosphine.

20. The LP-MOCVD process according to claim 11, wherein said semi-insulating phosphorous containing Group III–V layer is single crystal material that is lattice matched to GaAs.

21. The LP-MOCVD process according to claim 11, wherein said semi-insulating phosphorous containing Group III–V layer is InGaP.

22. The LP-MOCVD process according to claim 11, wherein said step of forming is conducted at a standard LP-MOCVD reactor pressure, Group V/III ratio, and growth rate.

* * * * *